United States Patent
Chen (10) Patent No.: US 10,644,128 B1
(45) Date of Patent: May 5, 2020

(54) SEMICONDUCTOR DEVICES WITH REDUCED CHANNEL RESISTANCE AND METHODS FOR FABRICATING THE SAME

(71) Applicant: Vanguard International Semiconductor Corporation, Hsinchu (TW)

(72) Inventor: Chih-Yen Chen, Tainan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/241,008

(22) Filed: Jan. 7, 2019

(51) Int. Cl.
*H01L 29/66* (2006.01)
*H01L 21/02* (2006.01)
*H01L 29/423* (2006.01)
*H01L 21/768* (2006.01)
*H01L 29/417* (2006.01)

(52) U.S. Cl.
CPC .. *H01L 29/66462* (2013.01); *H01L 21/02362* (2013.01); *H01L 21/76832* (2013.01); *H01L 21/76843* (2013.01); *H01L 29/41791* (2013.01); *H01L 29/42356* (2013.01)

(58) Field of Classification Search
CPC ......... H01L 29/66462; H01L 21/76843; H01L 21/02362; H01L 29/42356
See application file for complete search history.

(56) References Cited

U.S. PATENT DOCUMENTS 8,723,222 B2 * 5/2014 Bae .................. H01L 29/66446
257/189
2006/0220165 A1 * 10/2006 Hase .................. H01L 29/7785
257/471

FOREIGN PATENT DOCUMENTS

| TW | 201407787 A | 2/2014 |
| TW | 201541636 A | 11/2015 |
| TW | 201635522 A | 10/2016 |

OTHER PUBLICATIONS

Taiwanese Office Action and Search Report dated Jul. 18, 2019, for corresponding Taiwanese Application No. 107141856.

* cited by examiner

*Primary Examiner* — William Coleman
(74) *Attorney, Agent, or Firm* — Birch, Stewart, Kolasch & Birch, LLP (57) ABSTRACT

A semiconductor device includes a channel layer, a first barrier layer, a second barrier layer, a source electrode, a drain electrode and a gate structure. The channel layer, the first barrier layer, and the second barrier layer are sequentially stacked over a substrate. The source electrode, a drain electrode and the gate structure extend through at least portions of the second barrier layer. The source electrode, the drain electrode and the gate structure have respective bottom surfaces located at substantially the same level as and adjacent to the first barrier layer.

20 Claims, 7 Drawing Sheets

FIG. 4

SEMICONDUCTOR DEVICES WITH REDUCED CHANNEL RESISTANCE AND METHODS FOR FABRICATING THE SAME

BACKGROUND

Technical Field

The disclosure relates to semiconductor devices, and more particularly, to high electron mobility transistors and methods for fabricating the same.

Description of the Related Art

Gallium nitride-based (GaN-based) semiconductor materials have many excellent characteristics, such as high thermal resistance, wide band-gap, and a high electron saturation rate. Therefore, GaN-based semiconductor materials are suitable for use in high-speed and high-temperature operating environments. In recent years, GaN-based semiconductor materials have been widely used in light-emitting diode (LED) elements and high-frequency elements, such as high electron mobility transistors (HEMT) with heterogeneous interfacial structures.

One of the most important factors affecting the power consumption of a semiconductor device is its On-Resistance ($R_{on}$), which is proportional to the power consumption of the semiconductor device. On-Resistance ($R_{on}$) includes source/drain contact resistance ($R_{contact}$) and channel resistance ($R_{channel}$). High electron mobility transistors (HEMTs) have two-dimensional electron gas (2DEG) formed at a heterogeneous interface resulting in the $R_{channel}$ of HEMTs being low due to high electron mobility and high carrier density of 2DEG. Therefore, $R_{contact}$ of HEMTs affects the overall performance of the $R_{on}$.

With the developments being made in GaN-based semiconductor materials, semiconductor devices that use GaN-based semiconductor materials are being applied in more critical working environments, such as those with higher frequencies or higher temperatures. Therefore, the process of fabricating semiconductor devices with GaN-based semiconductor materials faces various new challenges.

SUMMARY

Some embodiments of the present disclosure provide a semiconductor device. The semiconductor device includes a channel layer disposed over a substrate, a first barrier layer disposed over the channel layer, and a second barrier layer disposed over the first barrier layer. The semiconductor device also includes a source electrode, a drain electrode, and a gate structure disposed between the source electrode and the drain electrode. The source electrode, the drain electrode and the gate structure extend through at least portions of the second barrier layer. The source electrode, the drain electrode and the gate structure have respective bottom surfaces located at substantially the same level as and adjacent to the first barrier layer.

Some embodiments of the present disclosure provide a method for fabricating a semiconductor device. The method includes sequentially forming a channel layer, a first barrier layer and a second barrier layer over a substrate, and recessing the second barrier layer and the first barrier layer to form a source recess, a drain recess and a gate recess between the source recess and the drain recess. The source recess, the drain recess and the gate recess penetrate through at least portions of the first barrier layer and have respective bottom surfaces located at substantially the same level. The method also includes forming a source electrode, a drain electrode and a gate structure in the source recess, the drain recess and the gate recess, respectively.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

Figure 1:
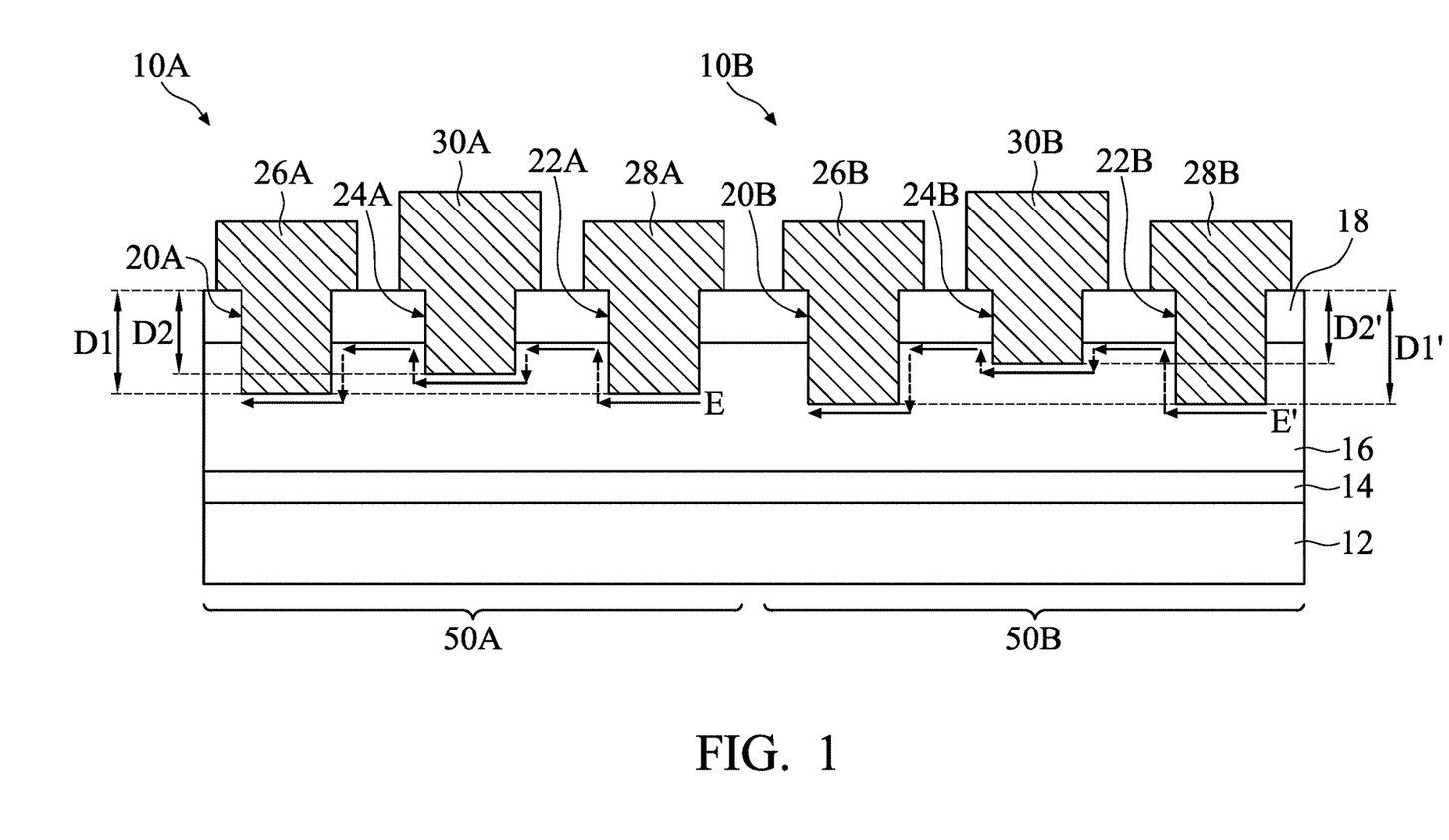
FIG. 1 illustrates a cross-sectional view of semiconductor devices in different regions of a substrate in accordance with some embodiments of the present disclosure.

Referring to FIG. 1, which illustrates a cross-sectional view of a semiconductor device 10A and a semiconductor device 10B in different regions of a substrate 102 in accordance with some embodiments of the present disclosure. In this embodiment, the semiconductor devices 10A and 10B are HEMTs.

Referring to FIG. 1, a substrate 12 is provided. The substrate 12 includes multiple regions, for example, a first region 50A and a second region 50B. Although not shown, the substrate 12 may include some other regions. A buffer layer 14, a channel layer 16 and a barrier layer 18 are sequentially formed over the substrate 12. A heterogeneous interface formed between the channel layer 16 and the barrier layer 18 can generate 2DEGs that are used as conductive carriers for the semiconductor devices 10A and 10B. In some embodiments, the material of the channel layer 16 may be a binary group III-V compound semiconductor such as GaN. The material of the barrier layer 18 may be a ternary group III-V compound semiconductor such as AlGaN. Generally, 2DEGs exist in a lateral direction parallel to the heterogeneous interface but hardly exist in a longitudinal direction perpendicular to the heterogeneous interface.

Next, a first etching process is performed to form a source recess 20A and a drain recess 22A in the first region 50A and a source recess 20B and a drain recess 22B in the second region 50B. The source recesses 20A and 20B and the drain recesses 22A and 22B penetrate through the barrier layer 18 and extend into the channel layer 16. The source recess 20A and the drain recess 22A in the first region 50A have a first etching depth D1 and the source recess 20B and the drain recess 22B in the second region 50B have a first etching depth D1'. The etching depths in different regions of the substrate 12 have a certain degree of variation (i.e. the uniformity of the etching depth). For example, the first etching depth D1 in the first region 50A may be unequal to the first etching depth D1' in the second region 50B, which depends on the ability of the etching process.

Next, a source electrode 26A and a drain electrode 28A are formed in the source recess 20A and the drain recess 22A respectively. A source electrode 26B and a drain electrode 28B are formed in the source recess 20B and the drain recess 22B respectively.

Next, a second etching process is performed to form a gate recess 24A in the first region 50A and a gate recess 24B in the second region 50B. The gate recesses 24A and 24B penetrate through the barrier layer 18 and extend into the channel layer 16. The gate recess 24A in the first region 50A has a second etching depth D2 and the gate recess 24B in the second region 50B has a second etching depth D2'. Similarly, the second etching depth D2 in the first region 50A may be unequal to the second etching depth D2' in the second region 50B.

Next, a gate structure 30A is formed in the gate recess 24A. A gate structure 30B is formed in the gate recess 24B. After the gate structures 30A and 30B are formed, the semiconductor devices 10A and 10B are produced.

It is worth noting that a current E or E' flows from the drain electrode to the source electrode when a semiconductor is operated. Because 2DEGs are hardly present in longitudinal paths of the current E or E' indicated by a broken line, the contact resistance ($R_c$) of the source and drain of the semiconductor device is increased, which in turn increases the overall on-resistance ($R_{on}$) of the semiconductor device.

Moreover, because the source and drain recesses are formed by the first etching process while the gate recesses are formed by the second etching process, the bottom surfaces of the source and drain recesses may not be located at the same level as the bottom surfaces of the gate recess. The difference between the levels of the bottom surfaces causes the channel coupling effect, which further increases the channel resistance ($R_{channel}$) of the semiconductor device. Furthermore, the two etching processes have respective etching uniformities, which results in increasing the difference in the channel resistance between the semiconductor devices in different regions (such as the semiconductor device 10A and the semiconductor device 10B), which in turn reduces the manufacturing stability of the semiconductor devices.

Figure 2A:
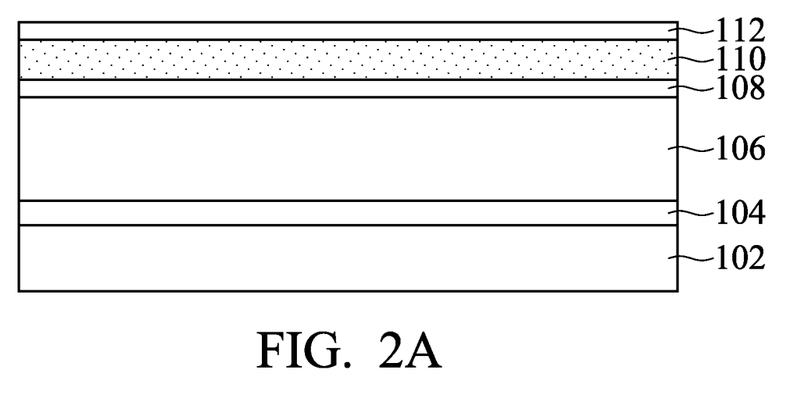
FIGS. 2A-2G illustrate cross-sectional views of forming a semiconductor device at various intermediate stages in accordance with some embodiments of the present disclosure.
Figure 2B:
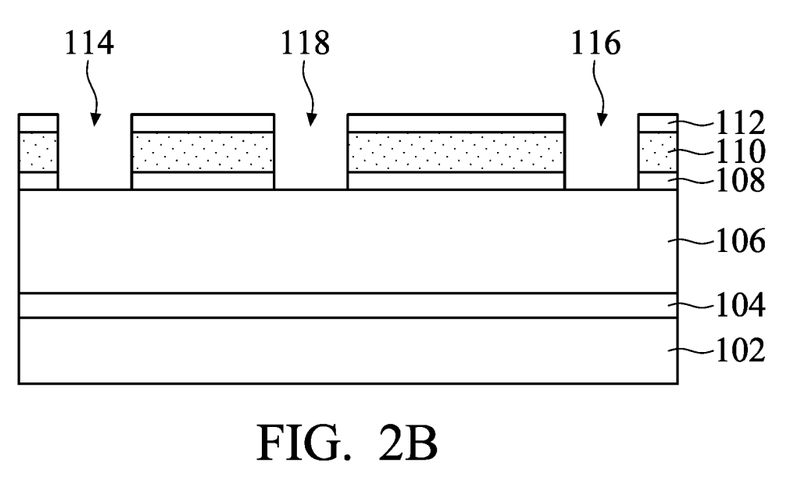
Figure 2C:
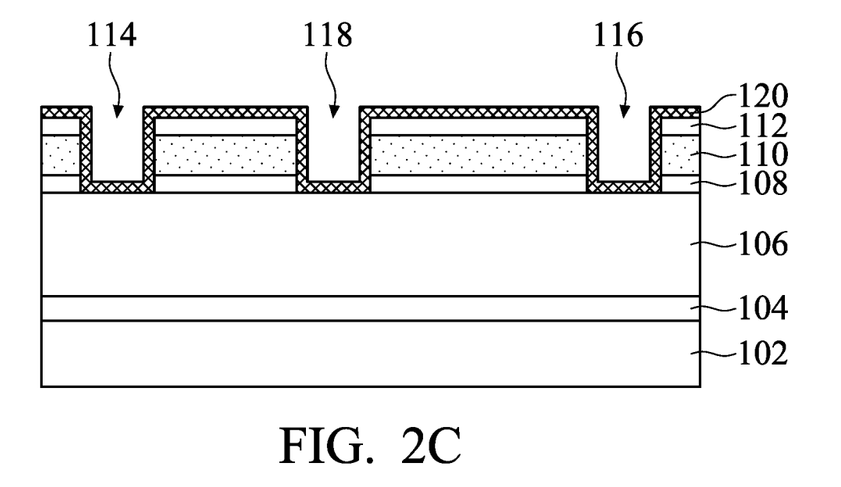
Figure 2D:
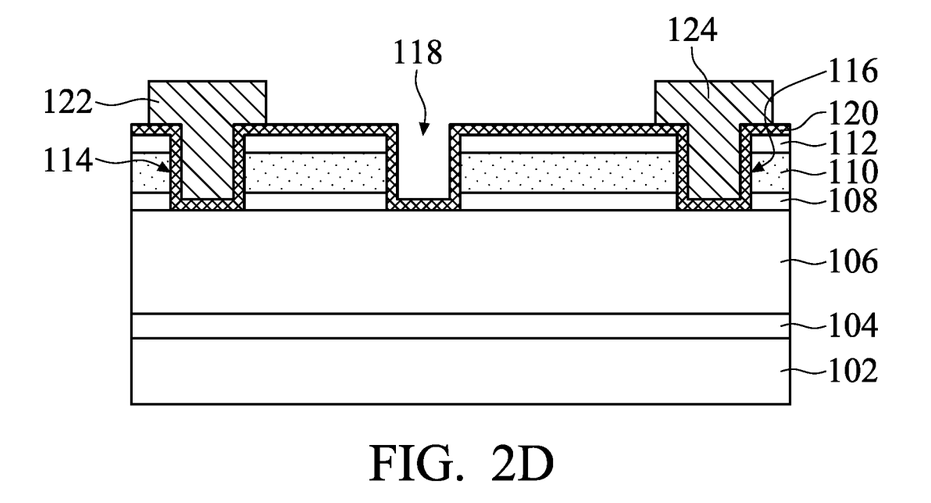
Figure 2E:
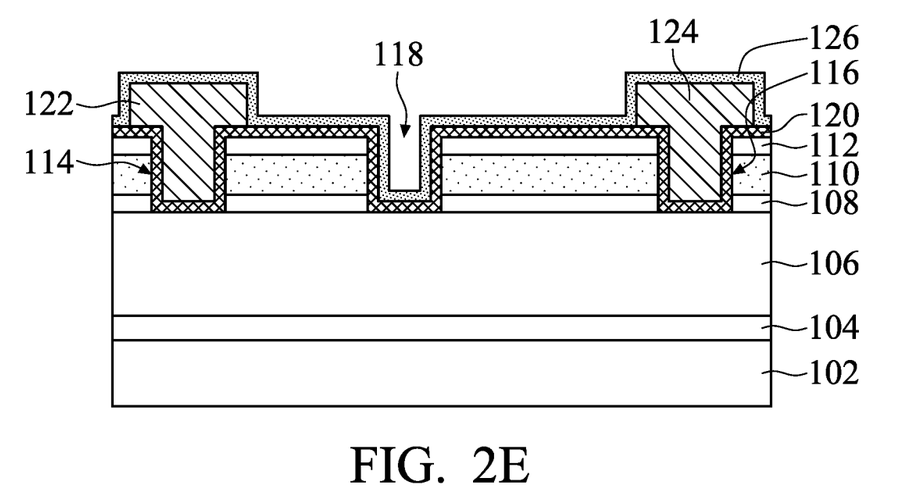
Figure 2F:
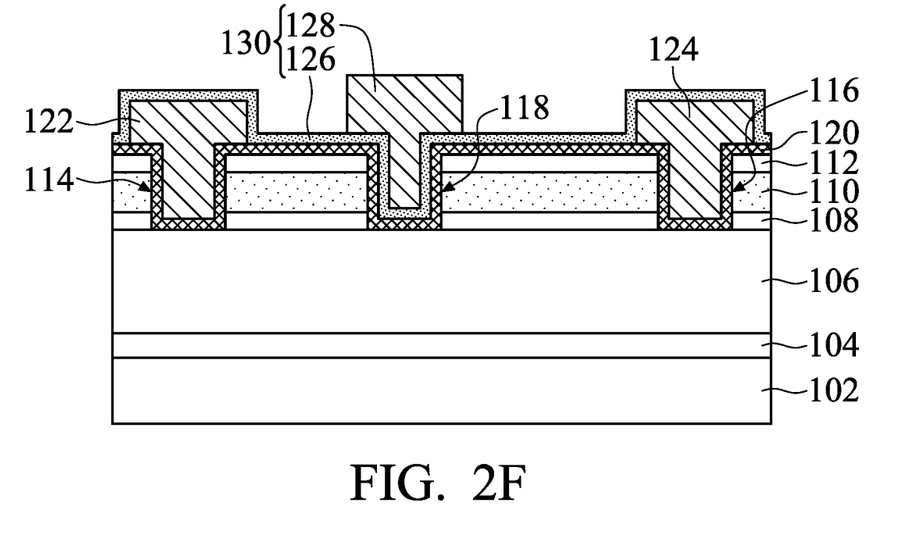
Figure 2G:
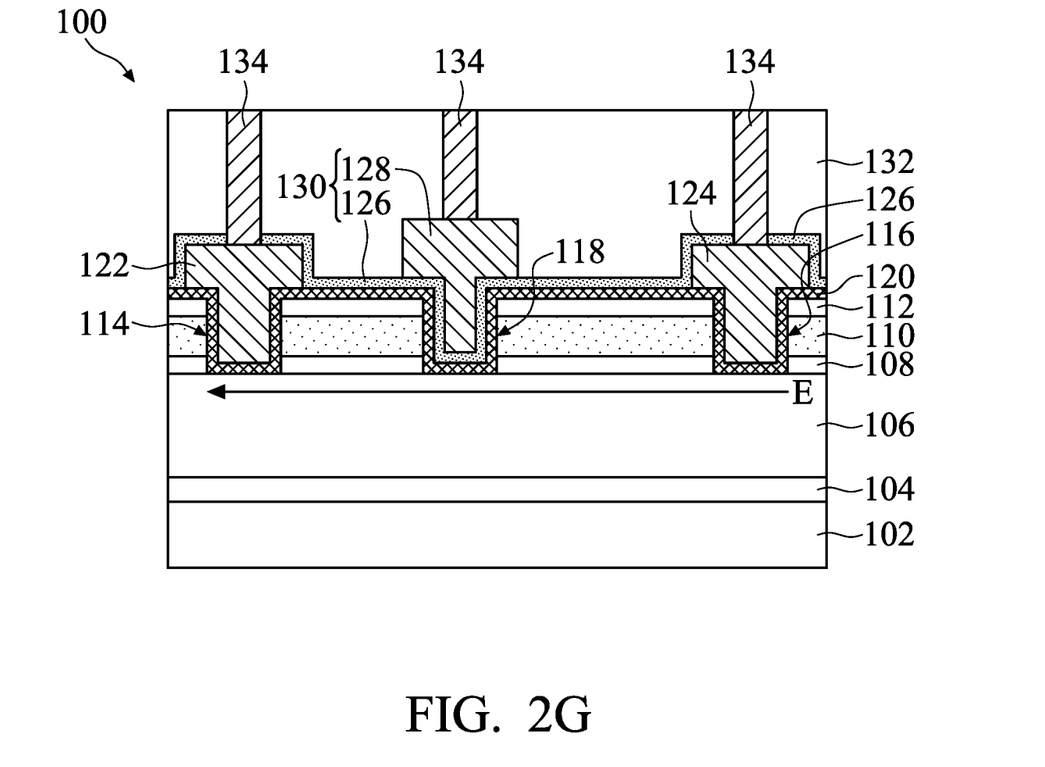

FIGS. 2A-2G illustrate cross-sectional views of forming a semiconductor device 100 shown in FIG. 2G at various intermediate stages in accordance with some embodiments of the present disclosure. In the embodiments of FIGS. 2A-2G one etching process is performed to form a source recess, a drain recess and a gate recess simultaneously, so that the source recess, the drain recess and the gate recess have respective bottom surfaces located at substantially the same level. As a result, the channel coupling effect can be avoided to reduce the channel resistance of a semiconductor device, and the difference in the channel resistance between the semiconductor devices in different regions can be reduced.

Referring to FIG. 2A, a semiconductor substrate 102 is provided. In some embodiments, the substrate 102 may be a doped (such as doped with a p-type or an n-type dopant) or an undoped semiconductor substrate, such as a silicon substrate, a silicon germanium substrate, or the like. In some embodiments, the substrate 102 may be a semiconductor-on-insulator substrate, such as a silicon-on-insulator (SOI) substrate. In some embodiments, the substrate 102 may be a glass substrate or a ceramic substrate, such as a silicon carbide (SiC) substrate, an aluminum nitride (AlN) substrate, or a sapphire substrate.

A buffer layer 104, a channel layer 106, a first barrier layer 108, a second barrier layer 110, and a capping layer 112 are sequentially formed over the substrate 102. In some embodiments, a seed layer (not shown) may be formed between the substrate 102 and the buffer layer 104.

The buffer layer 104 may be helpful in mitigating a strain of the channel layer 106 subsequently formed over the buffer layer 104 to prevent defects from forming in the channel layer 106. The strain is caused by a mismatch between the channel layer 106 and the substrate 102. In some embodiments, the material of the buffer layer 104 may be or include AlN, GaN, AlGaN, a combination thereof, or the like. The buffer layer 104 may be formed using an epitaxial growth process, such as metal organic chemical vapor deposition (MOCVD), hydride vapor phase epitaxy (HVPE), molecular beam epitaxy (MBE), or a combination thereof, or the like. Although the buffer layer 104 is a single layer in the embodiments shown in FIG. 2A, the buffer layer 104 may also be a multilayered structure. In addition, in some embodiments, the material of the buffer layer 104 is decided by the material of the seed layer and the gas introduced during the epitaxial process.

In some embodiments, the material of the channel layer 106 may be or include a binary group III-V compound semiconductor, such as group III nitride. In some embodiments, the material of the channel layer 106 is GaN. In some embodiments, the thickness of the channel layer 106 may be in a range from about 0.01 µm to about 10 µm. In some embodiments, the channel layer 106 may be doped, such as with an n-type or a p-type dopant. The channel layer 106 may be formed using an epitaxial growth process, such as MOCVD, HVPE, MBE, a combination thereof or the like.

In some embodiments, the material of the first barrier layer 108 may be or include binary group III-V compound semiconductor, such as AlN. In some embodiments, the first barrier layer 108 may be formed using an epitaxial growth process, such as MOCVD, HVPE, MBE, a combination thereof or the like. In some embodiments, the thickness of the first barrier layer 108 may be in a range from about 0.5 nm to about 10 nm, such as 2 nm. The first barrier layer may also serve as an etching stop layer, which will be described in detail below.

In some embodiments, the material of the second barrier layer 110 may be or include a ternary group III-V compound semiconductor, such as group III nitride. In some embodiments, the material of the second barrier layer 110 may be AlGaN, AlInN, or a combination thereof. In some embodiments, the second barrier layer 110 may be doped, such as with an n-type or a p-type dopant. In some embodiments, the second barrier layer 110 may be formed using an epitaxial growth process, such as MOCVD, HVPE, MBE, a combination thereof or the like. In some embodiments, the thickness of the second barrier layer 110 is greater than the thickness of the first barrier layer 108. The thickness of the second barrier layer 110 may be in a range from about 1 nm to about 80 nm.

Spontaneous polarization and piezoelectric polarization effects induced by the different band gap between the channel layer 106 and the first and second barrier layers 108 and 110 forms 2DEGs (not shown) at a heterogeneous interface between the channel layer 106 and the first barrier layer 108. The semiconductor device 100 shown in FIG. 2G is a high electron mobility transistor (HEMT) which utilizes 2DEG as conductive carriers. In addition, the material of the first barrier layer 108 selected from a binary group III-V compound semiconductor may induce a lower alloy scattering than the material of the first barrier layer 108 selected from a ternary group III-V compound semiconductor. As a result, 2DEGs can be formed to have a higher electron mobility to reduce the channel resistance of the semiconductor device.

In some embodiments, the material of the capping layer 112 may be or include GaN such as undoped GaN. In some embodiments, the capping layer formed over the second barrier layer 110 may be used to prevent the oxidation on the surface of the second barrier layer 110 including Al. In some embodiments, the thickness of the capping layer 112 may be in a range from about 1 nm to about 100 nm. In some embodiments, the capping layer 112 is formed using an epitaxial growth process, such as MOCVD, HVPE, MBE, a combination thereof or the like.

In some embodiments, the buffer layer 104, the channel layer 106, the first barrier layer 108, the second barrier layer 110, and the capping layer 112 may be in-situ deposited on the substrate 102 in the same deposition chamber.

Next, a patterning process is performed on the capping layer 112, the second barrier layer 110, and the first barrier layer 108.

Referring to FIG. 2B, the capping layer 112, the second barrier layer 110, and the first barrier layer 108 are recessed by the patterning process to form a source recess 114, a drain recess 116 and a gate recess 118 between the source recess 114 and the gate recess 118. The source recess 114, the drain recess 116 and the gate recess 118 penetrate through the capping layer 112, the second barrier layer 110 and the first barrier layer 108. After the patterning process, the source recess 114, the drain recess 116 and the gate recess 118 expose portions of the upper surface of the channel layer 106.

In some embodiments, the patterning process performed on the capping layer 112, the second barrier layer 110, and the first barrier layer 108 includes forming a patterning mask layer (not shown) over the upper surface of the capping layer 112. The patterning mask layer has openings which exposes portions of the upper surface of the capping layer 112. An etching process is then performed on the capping layer 112, the second barrier layer 110, and the first barrier layer 108 through the openings of the patterning mask layer to form the source recess 114, the drain recess 116 and the gate recess 118 simultaneously. Next, the patterning mask layer is removed by, for example, an ashing process or wet strip process. In some embodiments, the etching process may be reactive ion etch (RIE), electron cyclotron resonance (ERC) etching, inductively-coupled plasma (ICP) etch, neutral beam etch (NBE), the like, or a combination thereof.

In the embodiments of the present disclosure, the source recess 114, the drain recess 116 and the gate recess 118 are simultaneously formed in one etching process so that the source recess 114, the drain recess 116 and the gate recess 118 may have respective bottom surfaces located at substantially the same level.

As used herein, the term "substantially the same level" means that the difference between the levels of the bottom surfaces of the recesses 114, 116 and 118 are within a range of 2 nm, or 1 nm, or 0.5 nm. Alternatively, the term "substantially the same level" means that the difference between the levels of the bottom surfaces of the recesses 114, 116 and 118 are within 5% of the depth of the recess 114.

The first barrier layer 108 may serve as an etching stop layer. For example, in some embodiments, the first barrier layer 108 includes AlN and the second barrier layer 110 includes AlGaN. In an etching process, an etching rate of the second barrier layer 110 is higher etching process than an etching rate the first barrier layer 108. For example, in an etching process using $Cl_2$ or $SF_6$ as an etchant, a ratio of an etching rate of the second barrier layer 110 to an etching rate of the first barrier layer 108 is in a range from about 1.5 to about 50. The first barrier layer 108 may slow down the etching rate of the etching process to control where the bottom surfaces of the source recess 114, the drain recess 116 and the gate recess 118 stop. As a result, after the etching process, the source recess 114, the drain recess 116 and the gate recess 118 penetrate just through the first barrier layer 108 but do not extend into the channel layer 106. In other words, the respective bottom surfaces of the source recess 114, the drain recess 116 and the gate recess 118 are located at the same level as the bottom surface of the first barrier layer 108.

Figure 3:
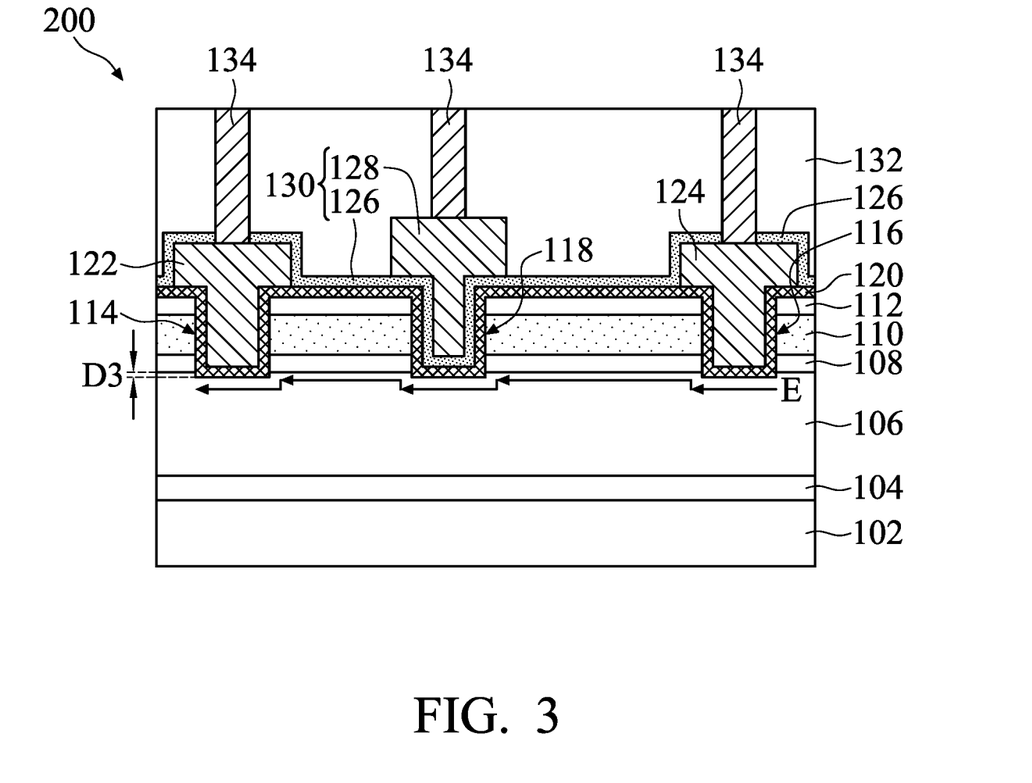
FIGS. 3 and 4 illustrate cross-sectional views of semiconductor devices in accordance with some other embodiments of the present disclosure.
Figure 4:
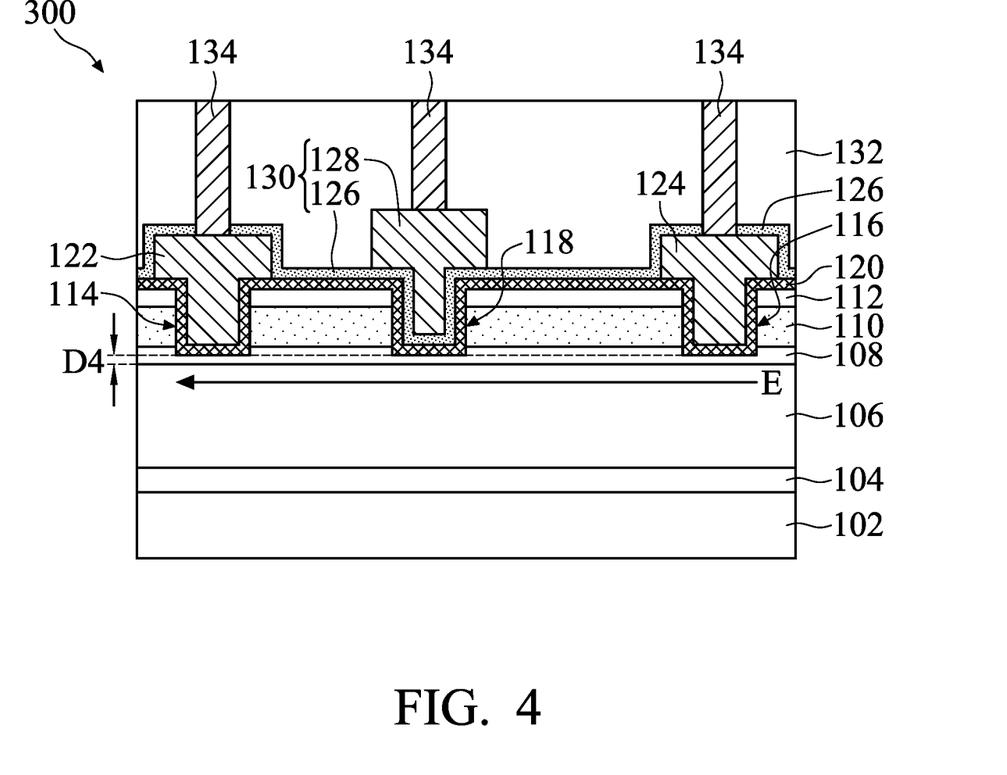

Although the embodiments of FIG. 2B shows that the recesses 114, 116 and 118 penetrate through the first barrier layer 108 but do not extend into the channel layer 106, the embodiments of the present disclosure are not limited thereto. In some other embodiments, the recesses 114, 116 and 118 may extend slightly into the channel layer 106, as shown in FIG. 3. In some other embodiments, the recesses 114, 116 and 118 may penetrate through only portions of the first barrier layer 108 but not expose the channel layer 106, as shown in FIG. 4.

Referring to FIG. 2C, a lining layer 120 is conformally formed on the capping layer 112 and in the source recess 114, the drain recess 116 and the gate recess 118. The lining layer 120 are conformally formed on the bottom surface and the sidewalls of the source recess 114, the bottom surface and the sidewalls of the drain recess 116, and the bottom surface and the sidewalls of gate recess 118 and partially fills the source recess 114, the drain recess 116 and the gate recess 118. In some embodiments, the thickness of the lining layer 120 may be in a range from about 0.5 nm to about 4 nm, such as 2 nm. In some embodiments, the material of the lining layer 120 may be or include a hexagonal crystal binary compound semiconductor, such as aluminum nitride (AlN), zinc oxide (ZnO), indium nitride (InN), a combination thereof, or the like. The lining layer 120 may be globally formed over the substrate 102 by using atomic layer deposition (ALD) or an epitaxial growth process, such as MOCVD.

Referring to FIG. 2D, a source electrode 122 and drain electrode 124 are formed on the lining layer 120 in the remaining portions of the source recess 114 and the drain recess 116. The source electrode 122 has an upper portion above the upper surface of the capping layer 112 and a lower portion in the source recess 114. The drain electrode 124 has an upper portion above the upper surface of the capping layer 112 and a lower portion in the source recess 114.

In some embodiments, the material of the source electrode 122 and the drain electrode 124 may be or include conductive materials, such as metal material, metal silicide, semiconductor material, or a combination thereof. The metal material may be gold (Au), nickel (Ni), platinum (Pt), palladium (Pd), iridium (Ir), titanium (Ti), chromium (Cr), tungsten (W), aluminum (Al), copper (Cu), TiN, the like, a combination thereof, an alloy thereof, or multilayers thereof. The semiconductor material may be polysilicon or polygermanium. In some embodiments, the steps of forming the source electrode 122 and the drain electrode 124 may include depositing a conductive material (not shown) for the source electrode 122 and the drain electrode 124 over the substrate 102 and in the remaining portions of the source recess 114 and the drain recess 116, and performing a patterning process on the conductive material to form the source electrode 122 and the drain electrode 124. The deposition process for forming the conductive material may be ALD, CVD, physical vapor deposition (PVD) such as sputtering, a combination thereof, or the like.

Referring to FIG. 2E, a dielectric layer 126 is conformally formed on the lining layer 120 in the remaining portion of the gate recess 118 to serve as a gate dielectric layer. The dielectric layer 126 is formed further on the lining layer 120 above the upper surface of the capping layer 120. The dielectric layer 126 is formed further on the upper surface and the sidewalls of the source electrode 122 and the upper surface and the sidewalls of the drain electrode 124. The material of the dielectric layer 126 may be or include silicon oxide ($SiO_2$), silicon nitride (SiN), aluminum oxide ($Al_2O_3$), aluminum nitride (AlN), hafnium oxide ($HfO_2$), a combination thereof, multilayers thereof, or the like. The dielectric layer 126 may be globally formed over the substrate 102 by ALD, CVD, PVD such as sputtering, a combination thereof, or the like.

Referring to FIG. 2F, a gate electrode 128 is formed on the dielectric layer 126 in the remaining portion of the gate recess 118. The gate electrode 128 has an upper portion above the upper surface of the capping layer 112 and a lower portion in the gate recess 118. The gate electrode 128 and the dielectric layer 126 in combination serve as a gate structure 130. In some embodiments, the material of the gate electrode 128 may be or include a conductive material, such as a metal material, a metal silicide, a semiconductor material, or a combination thereof. The metal material may be gold (Au), nickel (Ni), platinum (Pt), palladium (Pd), iridium (Ir), titanium (Ti), chromium (Cr), tungsten (W), aluminum (Al), copper (Cu), TiN, the like, a combination thereof, an alloy thereof, or multilayers thereof. The semiconductor material may be a polysilicon or a poly-germanium. The steps of forming the gate electrode 114 may include depositing a conductive material (not shown) for the gate electrode 128 over the substrate 102 and in the remaining portion of the gate recess 118, and performing a patterning process on the conductive material to form the gate electrode 128. The deposition process for forming the conductive material may be ALD, CVD, PVD such as sputtering, a combination thereof, or the like.

Referring to FIG. 2G, an interlayer dielectric (ILD) layer 132 is formed over the substrate 102. The ILD layer 132 covers the gate structure 130, the source electrode 122 and the drain electrode 124. Next, contacts 134 are formed in the ILD layer 132. The contacts 134 are in electrical connection with the gate structure 130, the source electrode 122 and the drain electrode 124 respectively.

In some embodiments, the material of the ILD layer 132 may be or include silicon oxide, silicon nitride, silicon oxynitride, aluminum oxide, a combination thereof, multilayers thereof, or the like. The ILD layer 132 may be globally formed over the substrate 102 by CVD such as plasma-enhanced CVD (PECVD), ALD, or the like.

In some embodiments, the material of the contacts 134 may be metal material such as gold (Au), nickel (Ni), platinum (Pt), palladium (Pd), iridium (Ir), titanium (Ti), chromium (Cr), tungsten (W), aluminum (Al), copper (Cu), a combination thereof, or multilayers thereof. The steps of forming the contacts 134 may include forming openings (not shown) corresponding to the source electrode 122, the drain electrode 124 and the gate electrode 128 by a patterning process. The openings penetrate through the ILD layer 132 and the dielectric layer 126 over the source electrode 122, the drain electrode 124 and the gate electrode 128 and expose portions of the upper surfaces of the source electrode 122, the drain electrode 124 and the gate electrode 128. A metal material is deposited on the ILD layer 132 and fills the openings. A planarization process such as chemical mechanical polish (CMP) is performed to remove the portion of the metal material above the ILD layer 120.

After the ILD layer 132 and the contacts 134 are formed, a semiconductor device 100 is produced. The semiconductor device 100 may also be referred to as a metal-insulator-semiconductor field effect transistor (MIS-FET).

In the embodiments shown in FIGS. 2A-2G, the semiconductor device 100 includes the channel layer 106, the first barrier layer 108 and the second barrier layer 110 sequentially formed over the substrate 102. The semiconductor device 100 also includes the source electrode 122, the drain electrode 124 and the gate structure 130 between the source electrode 122, the drain electrode 124, and the gate structure 130 between the source electrode 122 and the drain electrode 124. The source electrode 122, the drain electrode 124 and the gate structure 130 extend at least through portions of the second barrier layer 110. The source electrode 122, the drain electrode 124 and the gate structure 130 have respective bottom surfaces located at substantially the same level. The semiconductor device 100 also includes the lining layer 120 which is conformally disposed on the respective bottom portions of the source electrode 122, the drain electrode 124 and the gate structure 130. The lining layer 120 has a bottom surface located at the same level as the bottom surface of the first barrier layer 108.

In the embodiments shown in FIGS. 2A-2G, the recesses 114, 116 and 118 for forming the source electrode 122, the drain electrode 124 and the gate structure 130 penetrate through the first and the second barrier layers 108 and 110 so that the heterogeneous interface between the first barrier layer 108 and the channel layer 106 is not present in the region where the source/drain electrodes and the gate electrode are formed, which reduces or eliminates 2DEG formed beneath the source electrode 122, the drain electrode 124 and the gate structure 130. It should be noted that since the lining layer 120 including a hexagonal crystal binary compound semiconductor formed between the bottom portions of the source electrode 122, the drain electrode 124 and the gate structure 130 and the channel layer 106, the spontaneous polarization and the piezoelectric polarization can be induced between the lining layer 120 and the channel layer 106 to recover the reduced or eliminated 2DEG described above. As a result, the lining layer 120 can serve as a 2DEG recovery layer to reduce the contact resistance between the source and drain electrodes 122 and 124 and the channel layer 106 and the on-resistance beneath the gate structure 130.

In addition, in the embodiments shown in FIGS. 2A-2G, the source recess 114, the drain recess 116 and the gate recess 118 are formed by the same etching process so that the difference in the channel resistance between the semiconductor devices in different regions can be reduced, which improves the manufacturing stability of the semiconductor devices. Moreover, reducing a patterning process of forming a gate recess not only improves the manufacturing efficiency of the semiconductor devices but also reduces the damage to the gate structure caused by chemicals (such as photoresist or developer used in the patterning process), thereby improving the performance of the semiconductor devices.

Furthermore, the source recess 114, the drain recess 116 and the gate recess 118 have respective bottom surfaces located at substantially the same level, which prevents the channel coupling effect as described above in FIG. 1 so that the channel resistance can be reduced, which improves the performance of the semiconductor device.

Furthermore, because the first barrier layer 108 formed between the channel layer 106 and the second barrier layer 110 serves as an etching stop layer, it is better control the bottom surfaces of the source recess 114, the drain recess 116 and the gate recess 118 located at the same level as the bottom surface of the first barrier layer 108. As a result, when the semiconductor 100 is operated, a current E which flows from the drain electrode 124 to the source electrode 122 can have a horizontal path parallel to the heterogeneous interface and hardly has a longitudinal path perpendicular to the heterogeneous interface, which further reduces the channel resistance of the semiconductor device 100.

The embodiments shown in FIGS. 2A-2G are merely examples and are not intended to be limiting. The methods of the present disclosure may be also applied to other semiconductor devices except for the embodiments shown in FIGS. 2A-2G.

The FIG. 3 illustrates a cross-sectional view of a semiconductor device 200 in accordance with some other embodiments of the present disclosure. Elements or layers in FIG. 3 that are the same or similar to those in FIGS. 2A-2G are denoted by like reference numerals that have the same meaning, and the description thereof will not be repeated for the sake of brevity. The difference between the embodiments shown in FIGS. 3 and 2G is that the lining layer 120 formed in the source recess 114, the drain recess 116 and gate recess 118 has a bottom surface located at a level below the bottom surface of the first barrier layer 108.

Referring to FIG. 3, the capping layer 112, the second barrier layer 110, the first barrier layer 108 and the channel layer 106 are recessed to form a source recess 114, a drain recess 116 and a gate recess 118 by a patterning process similar to that described above in FIG. 2B. The source recess 114, the drain recess 116 and the gate recess 118 penetrate through the capping layer 112, the second barrier layer 110 and the first barrier layer 108 and extend into the channel layer 106 to a dimension D3. The dimension D3 is in a range from about 1 nm to about 50 nm.

In the embodiments of FIG. 3, the respective bottom surfaces of the source recess 114, the drain recess 116 and the gate recess 118 are located slightly below the bottom surface of the first barrier layer 108. As a result, when the semiconductor 200 is operated, a current E which flows from the drain electrode 124 to the source electrode 122 has a longitudinal path perpendicular to the heterogeneous interface so that the channel resistance of the semiconductor device 200 is slightly greater than the semiconductor device 100. However, the etching process extends the recesses 114, 116 and 118 into the channel layer 106 to form a deeper etching depth so that the recesses 114, 116 and 118 in the substrate 102 in different regions can have better etching depth uniformity (i.e. lower uniformity). The better etching depth uniformity can reduce the difference in channel resistance between the semiconductor devices in different regions, which improves the manufacturing stability of the semiconductor devices.

The FIG. 4 illustrates a cross-sectional view of a semiconductor device 300 in accordance with some other embodiments of the present disclosure. Elements or layers in FIG. 4 that are the same or similar to those in FIGS. 2A-2G are denoted by like reference numerals that have the same meaning, and the description thereof will not be repeated for the sake of brevity. The difference between the embodiments shown in FIGS. 4 and 2G is that the lining layer 120 formed in the source recess 114, the drain recess 116 and the gate recess 118 has a bottom surface located at a level above the bottom surface of the first barrier layer 108. In specific, the respective bottom surfaces of the recesses 114, 116 and 118 are located at a level between the upper surface and the bottom surface of the first barrier layer 108.

Referring to FIG. 4, the capping layer 112, the second barrier layer 110 and the first barrier layer 108 are recessed to form a source recess 114, a drain recess 116 and a gate recess 118 by a patterning process similar to that described above in FIG. 2B. The source recess 114, the drain recess 116 and the gate recess 118 penetrate through the capping layer 112, the second barrier layer 110 and portions of the first barrier layer 108. The respective bottom surfaces of the recesses 114, 116 and 118 stop in the first barrier layer 108. The portion of the first barrier layer 108 below the recesses 114, 116 and 118 has a dimension D4 that is in a range from about 0.5 nm to about 5 nm. After the etching process of the patterning process, the respective bottom surfaces of the source recess 114, the drain recess 116 and the gate recess 118 are located at a level above the bottom surface of the first barrier layer 118.

In summary, in the embodiments of the present disclosure, the source recess, the drain recess and the gate recess are simultaneously formed in the same etching process to have respective bottom surfaces located at substantially the same level. Therefore, the channel coupling effect can be avoided, which reduces the channel resistance of the semiconductor device and the difference in the channel resistance between the semiconductor devices in different regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a channel layer disposed over a substrate;
   a first barrier layer disposed over the channel layer;
   a second barrier layer disposed over the first barrier layer;

a source electrode, a drain electrode, and a gate structure disposed between the source electrode and the drain electrode, wherein the source electrode, the drain electrode and the gate structure extend through at least portions of the second barrier layer, and wherein the source electrode, the drain electrode and the gate structure have respective bottom surfaces located at substantially the same level as and adjacent to the first barrier layer; and a lining layer conformally disposed on respective bottom portions of the source electrode, the drain electrode and the gate structure.

2. The semiconductor device as claimed in claim 1, wherein the lining layer has a bottom surface that is located at the same level as or below a bottom surface of the first barrier layer.

3. The semiconductor device as claimed in claim 1, wherein the lining layer has a bottom surface that is located at a level above a bottom surface of the first barrier layer.

4. The semiconductor device as claimed in claim 1, wherein a material of the first barrier layer is AlN.

5. The semiconductor device as claimed in claim 2, wherein the lining layer has a bottom surface that is located between the bottom surface and an upper surface of the first barrier layer.

6. The semiconductor device as claimed in claim 2, wherein the lining layer is further formed over an upper surface of the second barrier layer.

7. The semiconductor device as claimed in claim 2, wherein a material of the lining layer includes a hexagonal crystal binary compound semiconductor.

8. The semiconductor device as claimed in claim 2, wherein the gate structure includes:
a dielectric layer, and
a gate electrode disposed on the dielectric layer, wherein the dielectric layer is disposed between the lining layer and the gate electrode.

9. The semiconductor device as claimed in claim 7, wherein the hexagonal crystal binary compound semiconductor includes AlN, ZnO or InN.

10. The semiconductor device as claimed in claim 8, wherein the dielectric layer is further disposed on an upper surface and a sidewall of the source electrode and an upper surface and a sidewall of the drain electrode.

11. A method for fabricating a semiconductor device, comprising:
sequentially forming a channel layer, a first barrier layer and a second barrier layer over a substrate;
recessing the second barrier layer and the first barrier layer to form a source recess, a drain recess and a gate recess between the source recess and the drain recess, wherein the source recess, the drain recess and the gate recess penetrate through at least portions of the first barrier layer and have respective bottom surfaces located at substantially the same level; and
forming a source electrode, a drain electrode and a gate structure in the source recess, the drain recess and the gate recess, respectively.

12. The method as claimed in claim 11, wherein recessing the second barrier layer and the first barrier layer includes performing an etching process on the second barrier layer and the first barrier layer to simultaneously form the source recess, the drain recess and the gate recess.

13. The method as claimed in claim 11, wherein the respective bottom surfaces of the source recess, the drain recess and the gate recess are located at the same level as or below a bottom surface of the first barrier layer.

14. The method as claimed in claim 11, wherein the respective bottom surfaces of the source recess, the drain recess and the gate recess are located at a level between a bottom surface and an upper surface of the first barrier layer.

15. The method as claimed in claim 11, further comprising:
conformally forming a lining layer on the bottom surface and a sidewall of the source recess, the bottom surface and a sidewall of the drain recess, and the bottom surface and a sidewall of the gate recess.

16. The method as claimed in claim 11, wherein a material of the first barrier layer is AlN.

17. The method as claimed in claim 15, wherein a material of the lining layer includes a hexagonal crystal binary compound semiconductor.

18. The method as claimed in claim 15, wherein forming the gate structure comprises:
conformally forming a dielectric layer on the lining layer in the gate recess; and
forming a gate electrode on the dielectric layer in the gate recess.

19. The method as claimed in claim 17, wherein the hexagonal crystal binary compound semiconductor includes AlN, ZnO or InN.

20. The method as claimed in claim 18, wherein the dielectric layer is formed further on an upper surface and the sidewall of the source electrode and an upper surface and the sidewall of the drain electrode.

* * * * *